United States Patent [19]
Holscher et al.

[11] Patent Number: 6,107,002
[45] Date of Patent: Aug. 22, 2000

[54] REDUCING RESIST SHRINKAGE DURING DEVICE FABRICATION

[75] Inventors: Richard D. Holscher; Ardavan Niroomand, both of Boise, Id.

[73] Assignee: Micron Technology, Inc., Boise, Id.

[21] Appl. No.: 09/181,895

[22] Filed: Oct. 29, 1998

[51] Int. Cl.$^7$ .................................................... G03F 7/40
[52] U.S. Cl. .......................... 430/313; 430/325; 430/328
[58] Field of Search ..................... 430/311, 313, 430/322, 323, 324, 328, 325

[56] References Cited

U.S. PATENT DOCUMENTS

| | | | |
|---|---|---|---|
| 4,812,542 | 3/1989 | Schwalm et al. | 526/265 |
| 5,385,809 | 1/1995 | Bohrer et al. | 430/311 |
| 5,691,110 | 11/1997 | Bohrer et al. | 430/270.1 |
| 5,814,432 | 9/1998 | Kobayashi | 430/312 |
| 5,879,851 | 3/1999 | Takahashi | 430/149 |
| 5,968,712 | 10/1999 | Thackeray | 430/326 |

*Primary Examiner*—Kathleen Duda
*Attorney, Agent, or Firm*—Dickstein Shapiro Morin & Oshinsky LLP

[57] ABSTRACT

A method of fabricating an electronic device includes forming a pattern of a resist material on a substrate. The resist includes a polymer and an acid-generating agent. The resist pattern is exposed to radiation to activate the acid-generating agent, and a neutralizing agent is provided to reduce the bond-breaking activity of the acid with respect to protective groups attached to the resist polymer. The substrate can subsequently be etched with the resist pattern defining an etch mask. By activating the acid-generating agent in the resist pattern and neutralizing the acid prior to performing an RIE or other dry etch, shrinkage of the resist pattern during the etch process can be reduced or eliminated.

21 Claims, 3 Drawing Sheets

REDUCING RESIST SHRINKAGE DURING DEVICE FABRICATION

BACKGROUND

The present invention relates generally to reducing the shrinkage of resist materials during the fabrication of semiconductor or other devices and, in particular, to techniques for reducing resist shrinkage that can occur during etch processes.

Lithographic processes are used to manufacture, for example, semiconductor devices, integrated optics and photomasks. Such processes employ various energy sources to create a relief image in a film of resist material applied on a substrate or wafer. Energy sources typically used in the lithographic processes include light and electron beam radiation.

Lithographic processes may use resists that contain polymeric materials, some of which include a protective group attached to the polymer. The protective group facilitates the formation of the resist material and may alter the solubility characteristics of the polymer.

Certain protective groups, when attached to the polymer, function as moieties that render the polymer relatively insoluble in alkaline solution. In lithographic processes, the protective groups or moieties are removed upon irradiation and baking of the polymer film in the presence of a radiation-induced acid.

In some lithographic processes, the acid is provided by a photo-acid generator (PAG) that produces an acid moiety upon irradiation with deep ultraviolet (UV) light. An exemplary PAG/acid sensitive polymer combination includes onium salt as the PAG and a polymer such as poly(4-tertbutoxycarbonyloxystyrene) that has a reactive substituent such as a tert-butocarbonyl protective group. Alternatively, the polymer itself can provide an acid functionality upon chain scission, thereby eliminating the need for an added PAG. An exemplary acid sensitive polymer that provides an acidic functionality upon radiation-induced chain scission includes poly(4-tertbutoxycarbonyloxystyrene-sulfone). Such polymers are referred to as chemical amplification (CAM) polymers since the production of one molecule of acid by radiation induces a reaction in multiple reactive substituents in the acid sensitive polymer.

As a result of the removal of the protective groups or moieties, the polymer becomes more soluble in alkaline solutions. After a substantial percentage of the protective groups or moieties have been cleaved from the exposed polymer, the polymer in the exposed region(s) of the film is substantially more soluble in an aqueous alkaline developing solution.

Acid generally is not generated in the non-exposed region(s). Therefore, the protective groups or moieties are not cleaved from the polymer in those region(s), and the resist material in those regions is not as soluble in an alkaline solution. If an alkaline solution is used to develop the image projected onto the resist, the material in the exposed region(s) is dissolved by the developer solution, while the material in the unexposed regions is not. A positive tone image or pattern is, thus, developed that corresponds to the image projected into the resist material.

In some device fabrication processes, the resulting resist pattern is used to define a mask for an etch process, such as a reactive ion etch (RIE) or other dry etch process. During such etch processes, however, the previously-unexposed resist pattern may be exposed to radiation in the form of a plasma or light, as well as energy in the form of heat. Depending on the wavelength(s) of the radiation in the etch chamber, acid may be generated in the resist. If the temperature in the etch chamber is sufficiently high, the acid can cleave the bonds of the protective groups or moieties in the resist, which can result in shrinkage of the resist pattern. Shrinkage of the resist during the etch process can result in distortion of the etch pattern and in a loss of image quality, so that the resist pattern is not properly transferred to the underlying layers of the device. Problems resulting from shrinkage of the resist can be particularly acute for wave-shaped, curve-shaped or S-shaped resist patterns. As illustrated in FIGS. 1A through 1D, shrinkage of a curve-shaped resist pattern can result in the top of the resist sloping away from the bottom of the resist. Thus, the desired pattern is not transferred properly to the underlying layers during subsequent etch processes.

SUMMARY

In general, the invention relates to techniques which can help reduce or eliminate shrinkage of the resist during an etch process. Prior to performing the etch process, a resist pattern is exposed to a source of radiation to activate an acid-generating agent within the resist. The acid that is generated is neutralized to prevent the acid from breaking bonds of the protective groups in the resist polymer and to reduce shrinkage of the resist during the etching process.

According to one aspect, a method of fabricating an electronic device includes forming a pattern of a resist material on a substrate. The resist includes a polymer and an acid-generating agent. The resist pattern is exposed to radiation to activate the acid-generating agent, and a neutralizing agent is provided to reduce the bond-breaking activity of the acid with respect to protective groups attached to the resist polymer. The substrate is etched with the resist pattern defining an etch mask.

In a related aspect, a method of fabricating an electronic device includes forming an etch mask on a substrate wherein the mask includes a polymer and a photo-acid generator. The mask is exposed to optical radiation to activate the photo-acid generator and a neutralizing agent is provided to reduce the bond-breaking activity of the acid with respect to protective groups attached to the polymer. The substrate with the mask thereon is etched after performing the steps of exposing the mask to optical radiation and providing the neutralizing agent.

In various implementations, one or more of the following features are present. The neutralizing agent can be a material having a pH greater than 7.0, such as a base or an amine. Particular examples are discussed in greater detail below. The neutralizing agent can be provided in the vicinity of the resist pattern prior to, during or after exposing the resist pattern to radiation to activate the acid-generating agent. In general, the wavelength selected for the source of radiation will depend on the particular resist or mask used.

In some embodiments, substantially all of the acid-generating agent in the resist is activated, and substantially all of the acid produced is neutralized by the neutralizing agent prior to etching the substrate.

In some implementations, the protective groups, when attached to the polymer, function as moieties that render the resist polymer relatively insoluble in alkaline solution.

The substrate can be supported on a temperature-controlled plate. The temperature of the plate is controlled to reduce the bond-breaking activity of the acid.

In various implementations, one or more of the following advantages are present. Shrinkage of the mask can be substantially reduced or prevented during the step of etching. Avoiding shrinkage of the resist pattern during the etch process can help prevent distortion of the etch pattern as well as a loss of image quality. The present invention, therefore, can help ensure that the resist pattern is properly transferred to the underlying layers of the device even for wave-shaped, curve-shaped or S-shaped resist patterns.

Other features and advantages will be readily apparent from the following detailed description, the accompanying drawings, and the claims.

BRIEF DESCRIPTION OF THE DRAWINGS

FIG. 1B is a cross-sectional view of FIG. 1A taken along line a—a.

FIG. 1D is a cross-sectional view of FIG. 1C taken along line b—b.

DETAILED DESCRIPTION

Figure 1A:
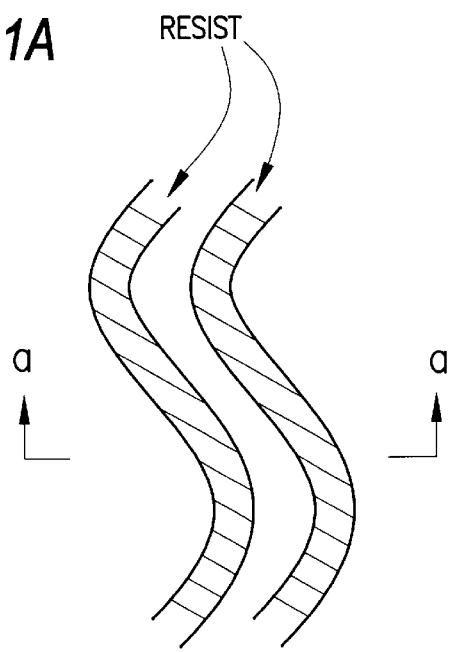
FIG. 1A shows a top view of an exemplary resist pattern prior to shrinkage.
Figure 1A:
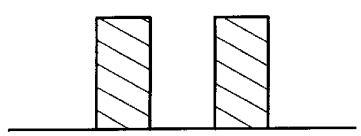
Figure 1C:
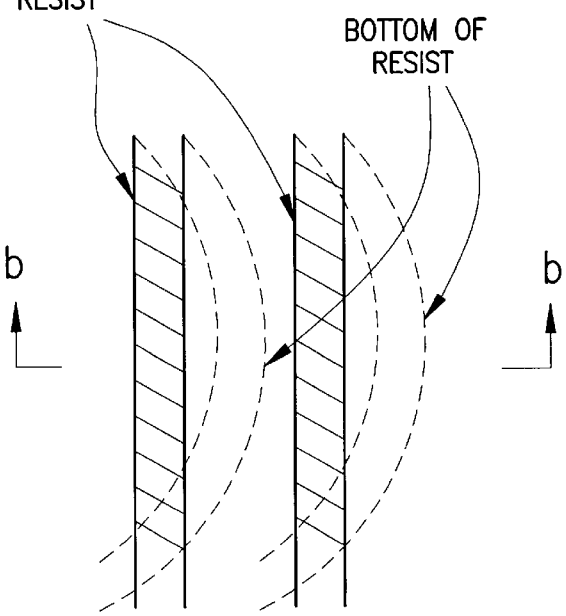
FIG. 1C shows a top view of the resist pattern of FIG. 5A after shrinkage.
Figure 1C:
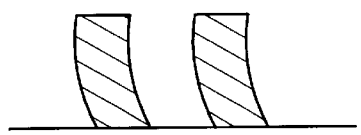
Figure 2:
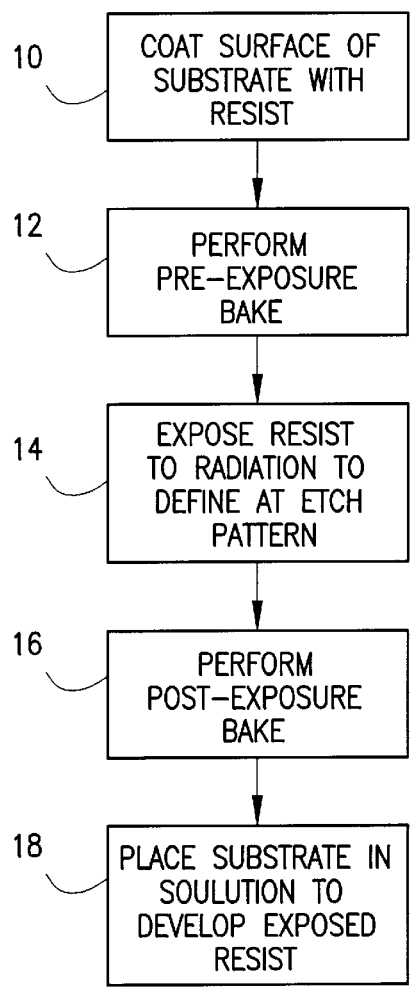
FIG. 2 illustrates a partial exemplary fabrication process for a semiconductor or other electronic device.

Referring to FIG. 2, a photolithographic technique includes coating the upper surface of a substrate, such as a silicon wafer, with a resist or other material that is sensitive to exposure radiation (step 10). The substrate can include active device regions and may include one or more layers formed in or on the silicon wafer. The resist can be, for example, a photoresist containing a photo-acid generator (PAG) that produces an acid moiety upon irradiation with deep ultraviolet (UV) light. Alternatively, the resist polymer itself can provide an acid functionality upon chain scission. More generally, the resist can be a chemical amplification (CAM) polymer which is sensitive to radiation. In general, wavelengths of less than about 400 nanometers (nm) are suitable, for example, 193 nm or 248 nm. In some cases, the resist may be sensitive to radiation over a range of wavelengths.

Figure 3:
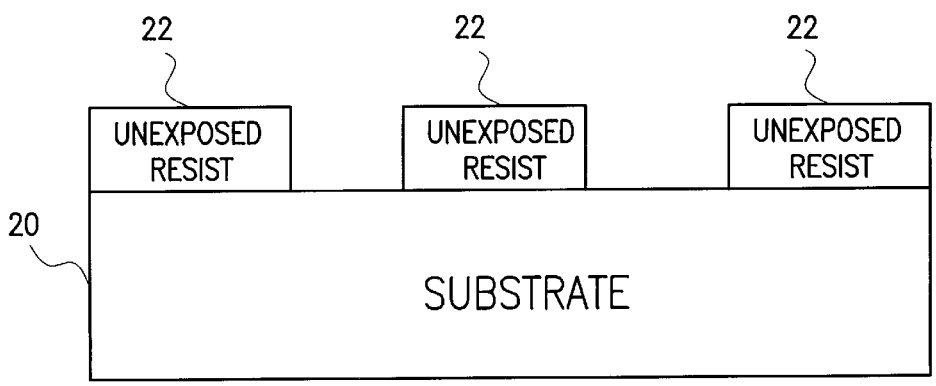
FIG. 3 illustrates a cross-section of an exemplary device following performance of the process of FIG. 2.

Prior to exposure to a source of exposure radiation, the substrate can be pre-baked at an elevated temperature (step 12). The substrate with the resist coating then is exposed to spatially discrete exposure radiation, for example, by passing light through a mask so that the light reaching the resist defines one or more discrete areas (step 14). The discrete area(s) define a pattern that is to be transferred to one or more layers of the underlying substrate, for example, by positive tone. A post-exposure bake can be performed prior to development of the exposed resist (step 16). The substrate then is placed, for example, in an alkaline solution to develop the image projected onto the resist (step 18). The resist in the exposed area(s) is dissolved by the developer solution, while the material in the unexposed regions is not. A positive tone image or pattern is, thus, developed that corresponds to the image projected into the resist material (see FIG. 3).

The resulting resist pattern 22 defines a mask for a subsequent etch process, such as an RIE or other dry etch technique. Prior to performing the etch process, however, the resulting resist pattern is exposed to a source of radiation to activate the acid-generating agent within the resist. The acid that is thereby generated is neutralized to prevent the acid from breaking bonds of the protective groups in the resist polymer and to reduce shrinkage of the resist during the etching process.

Figure 4:
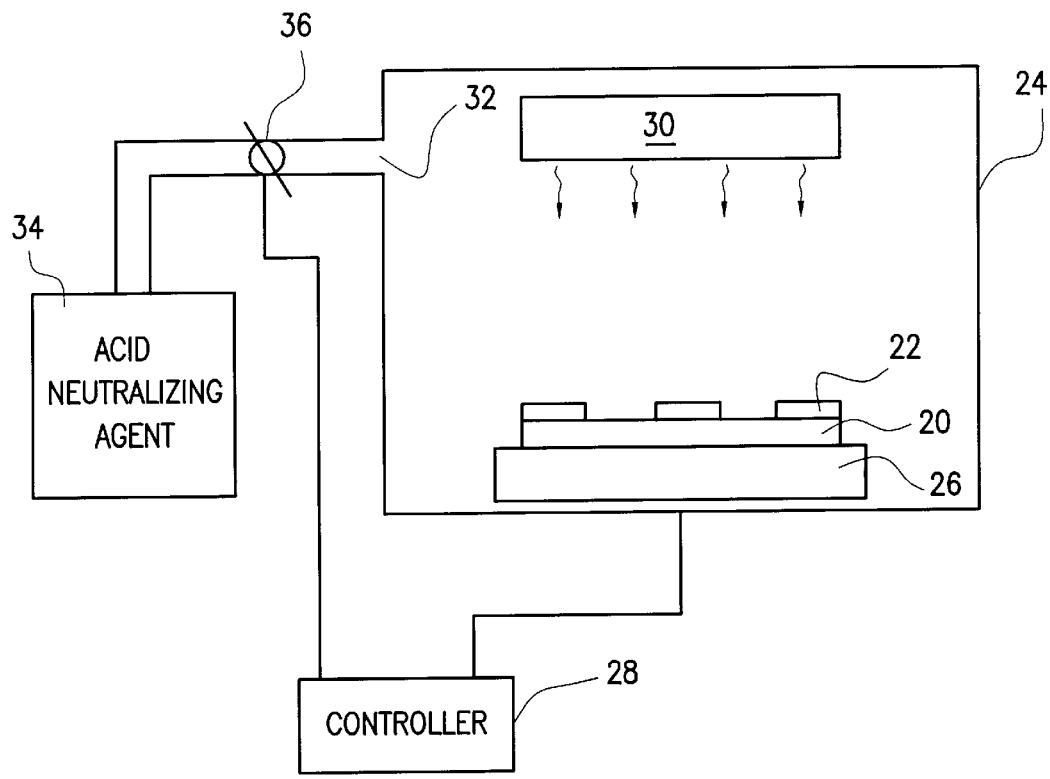
FIG. 4 illustrates a chamber in which a pre-etch process can be performed according to the invention.

Referring to FIG. 4, a chamber or box 24 includes a support 26 for the substrate 20. In some implementations, the substrate support 26 is a chill plate or other plate whose temperature can be controlled by a controller 28 such as a computer or other processor. The chamber 24 includes a radiation source 30 having a wavelength or range of wavelengths which can activate the acid-generating agent in the resist 22. Selection of the particular wavelength(s) as well as the radiation source 30 will depend on the particular acid-generating agent in the resist. Exemplary radiation sources 30 include an excimer laser tuned, for example, to emit radiation at about 193 nm or 248 nm. In other implementations, a mercury arc lamp can be used.

Generally, the source 30 will emit radiation at wavelengths less than about 400 nm.

The chamber 24 also includes an inlet 32 such as a pipe through which a neutralizing agent can be provided to the interior of the chamber. The neutralizing agent 34 helps neutralize the acid produced when the resist 22 is exposed to the radiation from the source 30. Ideally, all or substantially all of the acid-generating agent(s) in the resist 22 is activated upon exposure to the radiation from the source 30, and all or substantially all of the acid produced is neutralized by the neutralizing agent 34.

In general, the neutralizing agent 34 should be capable of diffusing into the resist 22 so as to prevent or inhibit the generated acid from breaking the bonds of the protective groups or moieties. The neutralizing agent 34 can be a base or an amine, in other words, a material such as a gas or liquid with a pH greater than 7.0. Examples of neutralizing agents 34 include ammonia gas ($NH_3$) and amines such as cyclohexamine, dimethylamine ethanol, diethylene triamine, diethyl amine and ethyl amine. Other suitable neutralizing agents 34 include morpholine, n-methyl-2-pyrrolidone, m-pyrol and n-methyl pyrol (NMP). The controller 28 can control or adjust the rate of flow of the neutralizing agent using a valve 36. Although the neutralizing agent 34 can be provided to the chamber interior at the same time or even after the resist pattern 22 is exposed to the source of radiation 30, the neutralizing agent preferably is provided to the chamber interior prior to exposure to allow the neutralizing agent to diffuse into the resist film and more effectively inhibit the bond-breaking activity of the acid.

The controller 28 controls the temperature of the substrate support 26 so that the temperature of the substrate 20 is kept below the activation temperature of the resist polymer, in other words, at a temperature which prevents, inhibits or reduces the ability of the generated acid to break the bonds of the protective groups.

In one particular implementation, a positive resist, known as SEPR-402 manufactured by the ShinEtsu Company of Japan, can be used as the resist. A substrate 20 with an unexposed resist pattern 22 is maintained in the chamber 24 at a temperature of between about −10 degrees Celsius (° C.) to about +70° C., and preferably between −10° C. to about +30° C. Ammonia gas is provided to the chamber interior, and the resist is exposed to radiation of less than about 400 nm, and preferably between about 193 nm and about 365 nm, for a duration of about one second to about one minute. The duration of the exposure depends, in part, on the intensity of the source 30.

Figure 5:
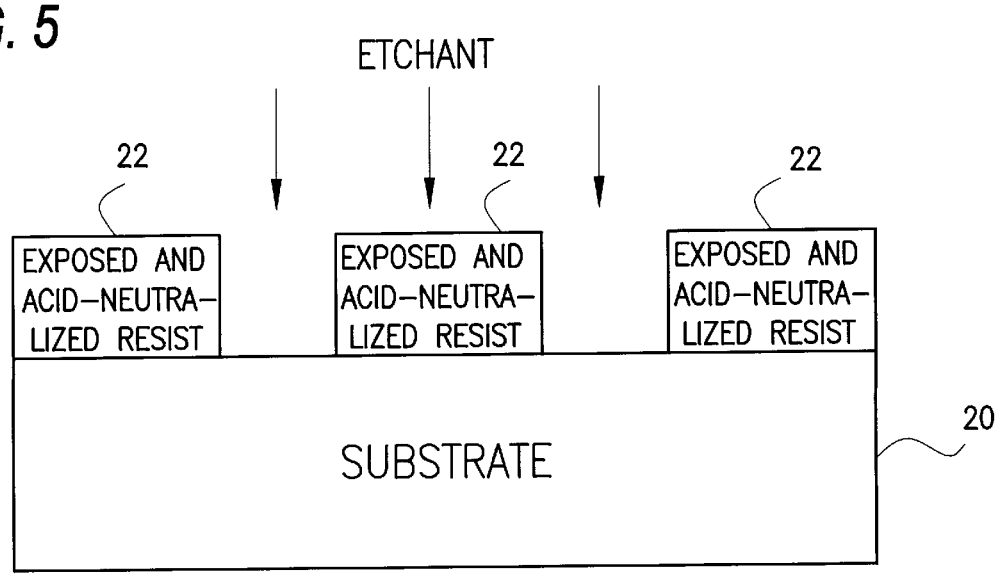
FIG. 5 illustrates a cross-section of the device of FIG. 3 during an etch process performed after processing in the chamber of FIG. 4.

Once the resist pattern 22 has been exposed to the radiation source 30 and the neutralizing agent has neutralized the acid generated by exposure to the radiation, an RIE or other dry etch process can be performed using the resist pattern as a mask (see FIG. 5). Since a substantial amount of the acid-generating agent in the resist pattern 22 previously was activated and the acid neutralized, little or no acid will be generated during the dry etch process. As a result, few or no additional chemical bonds between the protective groups and the resist polymer will be broken. Since few protective groups are released, shrinkage of the resist is reduced or eliminated even if the dry etch is performed in the presence of radiation, such as a plasma or light, that would otherwise activate the acid-generating acid and even if the dry etch is performed at an elevated temperature.

Avoiding shrinkage of the resist pattern during the etch process can help prevent distortion of the etch pattern as well as a loss of image quality. The present invention, therefore, can help ensure that the resist pattern is properly transferred to the underlying layers of the device even for wave-shaped, curve-shaped or S-shaped resist patterns.

Other implementations are within the scope of the following claims.

What is claimed is:

1. A method of fabricating an electronic device, the method comprising:
   developing a resist coating to provide a pattern of a resist material on a substrate, the resist including a polymer and an acid-generating agent;
   subsequently exposing the resist pattern to radiation to activate the acid-generating agent and providing a neutralizing agent to substantially inhibit a bond-breaking activity of the acid with respect to protective groups attached to the resist polymer; and
   etching the substrate with the resist pattern defining an etch mask.

2. The method of claim 1 wherein the resist pattern is curve-shaped.

3. The method of claim 1 wherein the neutralizing agent is a material having a pH greater than 7.0.

4. The method of claim 1 wherein the neutralizing agent is a base.

5. The method of claim 1 wherein the neutralizing agent includes ammonia gas.

6. The method of claim 1 wherein the neutralizing agent includes an amine.

7. The method of claim 6 wherein the neutralizing agent is selected from the group consisting of cyclohexamine, dimethylamine ethanol, diethylene triamine, diethyl amine and ethyl amine.

8. The method of claim 1 wherein the neutralizing agent is selected from the group consisting of morpholine, n-methyl-2-pyrrolidone, m-pyrol and n-methyl pyrol.

9. The method of claim 1 further including:
   supporting the substrate on a temperature-controlled plate, wherein the temperature of the plate is controlled to reduce the bond-breaking activity of the acid.

10. The method of claim 1 wherein the neutralizing agent is provided in the vicinity of the resist pattern prior to exposing the resist pattern to radiation to activate the acid-generating agent.

11. The method of claim 1 wherein substantially all of the acid-generating agent in the resist is activated, and substantially all of the acid produced is neutralized by the neutralizing agent prior to etching the substrate.

12. The method of claim 1 wherein etching includes performing a dry etch.

13. The method of claim 1 wherein etching includes performing a reactive ion etch.

14. The method of claim 1 wherein the protective groups, when attached to the polymer, function as moieties that render the resist polymer relatively insoluble in alkaline solution.

15. A method of fabricating an electronic device, the method comprising:
   developing a resist layer to form an etch mask on a substrate, the mask including a polymer and a photo-acid generator;
   subsequently exposing the mask to optical radiation to activate the photo-acid generator and providing a neutralizing agent to reduce a bond-breaking activity of the acid with respect to protective groups attached to the polymer; and
   etching the substrate with the mask thereon after exposing the mask to the optical radiation and providing the neutralizing agent.

16. The method of claim 15 wherein shrinkage of the mask is substantially prevented during the etching.

17. The method of claim 16 wherein the etch mask includes a curve-shaped pattern.

18. The method of claim 16 wherein the protective groups, when attached to the polymer, function as moieties that render the polymer relatively insoluble in alkaline solution.

19. The method of claim 18 further including:
   supporting the substrate on a temperature-controlled plate, wherein the temperature of the plate is controlled to reduce the bond-breaking activity of the acid.

20. The method of claim 18 wherein exposing the mask to optical radiation includes exposing the mask to radiation having a wavelength of about 193 nanometers.

21. The method of claim 18 wherein exposing the mask to optical radiation includes exposing the mask to radiation having a wavelength of about 248 nanometers.

* * * * *